US006946408B2

(12) United States Patent
Le et al.

(10) Patent No.: US 6,946,408 B2
(45) Date of Patent: Sep. 20, 2005

(54) METHOD AND APPARATUS FOR DEPOSITING DIELECTRIC FILMS

(75) Inventors: Hien-Minh Huu Le, San Jose, CA (US); Hoa T. Kieu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/857,181

(22) Filed: May 28, 2004

(65) Prior Publication Data

US 2005/0136691 A1 Jun. 23, 2005

Related U.S. Application Data

(63) Continuation-in-part of application No. 10/083,725, filed on Oct. 24, 2001, now Pat. No. 6,750,156.

(51) Int. Cl.$^7$ .......................... H01L 21/31; C23C 14/08
(52) U.S. Cl. .................... 438/785; 204/192.1
(58) Field of Search .................... 438/763, 769, 438/770, 785; 204/192.1, 192.13, 192.22, 204/192.26, 192.27, 192.28

(56) References Cited

U.S. PATENT DOCUMENTS

| | | |
|---|---|---|
| 5,942,089 A | 8/1999 | Sproul et al. |
| 5,977,582 A * | 11/1999 | Fleming et al. ............. 257/310 |
| 6,187,682 B1 | 2/2001 | Denning et al. |
| 6,315,873 B1 * | 11/2001 | Lowe et al. ........... 204/192.15 |
| 6,337,151 B1 | 1/2002 | Uzoh et al. |
| 6,413,858 B1 | 7/2002 | Chopra |
| 6,475,854 B2 | 11/2002 | Narwankar et al. |
| 6,537,428 B1 | 3/2003 | Xiong et al. |
| 6,677,254 B2 | 1/2004 | Narwankar et al. |
| 6,679,976 B2 * | 1/2004 | Baldwin et al. ........ 204/192.12 |
| 6,750,156 B2 * | 6/2004 | Le et al. ..................... 438/785 |
| 6,872,322 B1 * | 3/2005 | Chow et al. .................. 216/67 |
| 2002/0075631 A1 | 6/2002 | Singh et al. |
| 2003/0035906 A1 | 2/2003 | Memarian et al. |
| 2003/0056619 A1 * | 3/2003 | Kumar et al. ................. 75/245 |
| 2003/0124748 A1 | 7/2003 | Summerfelt et al. |
| 2003/0175142 A1 | 9/2003 | Milonopoulou et al. |

OTHER PUBLICATIONS

Christensen, De Reus, Bouwstra: Tantalum oxide thin films as protective coatings for sensors; proceedings from Micro Electro Mechanical Systems IEEE Int'l Conference; Jan. 17, 1999; Lake Buena Vista, Florida.

* cited by examiner

*Primary Examiner*—Alexander Ghyka
(74) *Attorney, Agent, or Firm*—Janah & Associates

(57) ABSTRACT

A method of depositing a dielectric film, such as tantalum oxide, on a substrate is described. In one example, a substrate is placed in a process zone to face a metal target and a pulsed DC voltage is applied to the target. A sputtering gas comprising a non-reactive component and an oxygen-containing component is introduced to the process zone in a volumetric flow ratio selected to achieve the desired x and y values in the deposited dielectric film, for example, in the deposition of a non-stoichiometric $Ta_xO_y$ film or in the deposition of a tantalum oxide film in which the oxidation state of tantalum is less than +5. The sputtering gas is removed from the process zone by condensing at least some of the non-reactive component on a cooled surface external to the process zone, and exhausting at least some of the oxygen-containing component from the process zone with moving rotors. A multiple layer dielectric film having different stoichiometric ratios in the layers can also be deposited by the instant method.

33 Claims, 5 Drawing Sheets

METHOD AND APPARATUS FOR DEPOSITING DIELECTRIC FILMS

CROSS-REFERENCE

This application is a continuation-in-part of U.S. patent application Ser. No. 10/083,725, entitled "Method and Apparatus for Forming an Anti-Reflective Coating on a Substrate" to Le et al, assigned to Applied Materials, Inc., and filed on Oct. 24, 2001, now U.S. Pat. No. 6,750,156 which is herein incorporated by reference in its entirety.

BACKGROUND

Embodiments of the present invention relates to the processing of a dielectric film on a substrate.

Dielectric films are used during the processing of substrates such as semiconductor wafers or displays. For example, dielectric films can be used as hard masks to increase the selectivity of an etch process. Dielectric films can also be used as anti-reflective coatings during the photolithographic patterning of interconnect features. Additionally, dielectric films can form component layers of features formed on substrates. For example, dielectric films with high dielectric constants can form gate dielectrics in metal gate transistors and insulators between metal electrodes in metal-insulator-metal capacitors. Dielectric films can also form protective layers in micro-electrical-mechanical system devices.

In conventional methods of depositing dielectric films by chemical vapor deposition (CVD) processes—in which a substrate is exposed to heated gases or a plasma of a gas composition—it is difficult to control or alter the chemical composition of the dielectric material being deposited. CVD processes typically rely on a chemical decomposition reaction to generate the desired dielectric material. However, CVD gases can have varying impurity levels from one batch to another. Also, CVD reactions often generate undesirable reaction byproducts as well as the desired dielectric material, since it is difficult to control the gas phase reactions in a plasma environment, thereby reducing the quality of the deposited film. CVD processes also often generate dielectric materials with stoichiometric ratios of elements that are inherent to the chemical reaction underlying the CVD process, and consequently, are difficult to control or change, because such a change would require a different chemical reaction which may not exist or may be difficult to induce. It is sometimes desirable to selectively alter the ratio of elements of a deposited dielectric film to obtain particular film properties, and to change the ratio of elements during the deposition process to obtain multilayer films.

Physical vapor deposition (PVD) processes—in which energized gases sputter material from a sputtering target which then deposits on the substrate—can be more easily altered to achieve a predefined composition of deposited dielectric material. For example, reactive gases can be added during the PVD process to deposit compounds that are mixtures of the target material and reactive gas species. PVD process can also use DC magnetrons to energize gases near the target by applying a DC voltage to the target. However, even such PVD methods can create problems when depositing dielectric films, because the target material and reactive gases can combine to create both metallic and insulating states on the surface of the target. Charged particles from the energized gases can also accumulate on the insulated portions of the target surface and eventually cause arcing within the process chamber. This is an electrical hazard and can damage chamber components or even create contaminants within the chamber by dislodging particles from interior chamber surfaces.

Thus, it is desirable to have a method and apparatus capable of depositing a dielectric film in which the ratio of elements within the deposited film can be controlled to obtain a selectively tuned stoichiometry of deposited material. It is also desirable to deposit such films with lower and more consistent levels of impurities in the deposited film. It is further desirable to have a deposition process in which deposition parameters can be controlled to achieve complex multilayered films with tunable properties.

SUMMARY

In one version, a dielectric film, such as non-stoichiometric tantalum oxide, can be deposited by placing a substrate in a process zone to face a target comprising tantalum, applying a pulsed DC voltage to the tantalum target, and introducing a sputtering gas to the process zone, the sputtering gas comprising a non-reactive component and an oxygen-containing component in a volumetric flow ratio that is selected to deposit a non-stoichiometric $Ta_xO_y$ film having a ratio of x moles of tantalum to y moles of oxygen. The sputtering gas is removed from the process zone by condensing at least some of the non-reactive component on a cooled surface external to the process zone, and exhausting at least some of the oxygen-containing component from the process zone using moving rotors.

In one embodiment, a tantalum oxide film is deposited on a substrate in a process chamber using a target comprising tantalum, by introducing a sputtering gas in the chamber, and applying a pulsed DC voltage to the tantalum target, the DC voltage being pulsed on and off, the on voltage having a value of about 200 V to about 800 V, the DC voltage being off for at least about 30% of the time of each pulse cycle, the pulse frequency of the DC voltage being about 100 kHz.

In another embodiment, a tantalum oxide film is deposited on a substrate in a process chamber using a target comprising tantalum, by introducing a sputtering gas comprising a non-reactive component and an oxygen-containing component in a volumetric flow ratio that is selected to deposit a $Ta_xO_y$ film having a ratio of x moles of tantalum to y moles of oxygen such that the oxidation state of tantalum is less than +5.

Instead of tantalum, the instant method can also be used to deposit other dielectric films, using a target comprising, for example, aluminum, hafnium, indium tin oxide, or silicon.

The ratio of the non-reactive component to the reactive component of the sputtering gas can also be changed during film deposition, to vary the x and y values of the deposited film through the thickness of the film. In one embodiment, the ratio is adjusted gradually and continuously through the thickness of the film to get a smoothly continuous varying ratio of elements through the film. In another version, the ratio is varied in discrete steps to provide multiple layers of a dielectric film, such as for example, a dielectric film containing $Ta_xO_y$ layers that each have a different stochiometry. For example, such a multiple layer dielectric film can be deposited on a substrate in a plurality of stages, including at least first and second stages. In the first stage, a first sputtering gas is introduced into the process zone, the first sputtering gas comprising a non-reactive component and a reactive component in a first ratio that is selected to deposit a dielectric film having a first ratio of elements. In the second stage, a second sputtering gas is introduced into the process zone, the second sputtering gas comprising a non-reactive component and a reactive component in a second ratio that is selected to deposit a dielectric film having a second ratio of elements that is a different ratio than the first ratio. The resultant multiple layer dielectric film has complex properties that are a summation of the properties of the individual layers.

DRAWINGS

These features, aspects, and advantages of the present invention will become better understood with regard to the following description, appended claims, and accompanying drawings which illustrate exemplary features of the invention:

Figure 5:
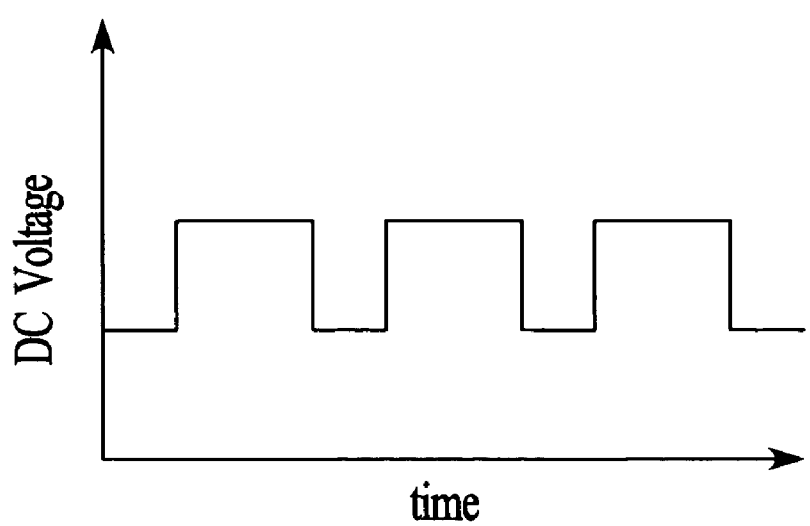
Figure 3:
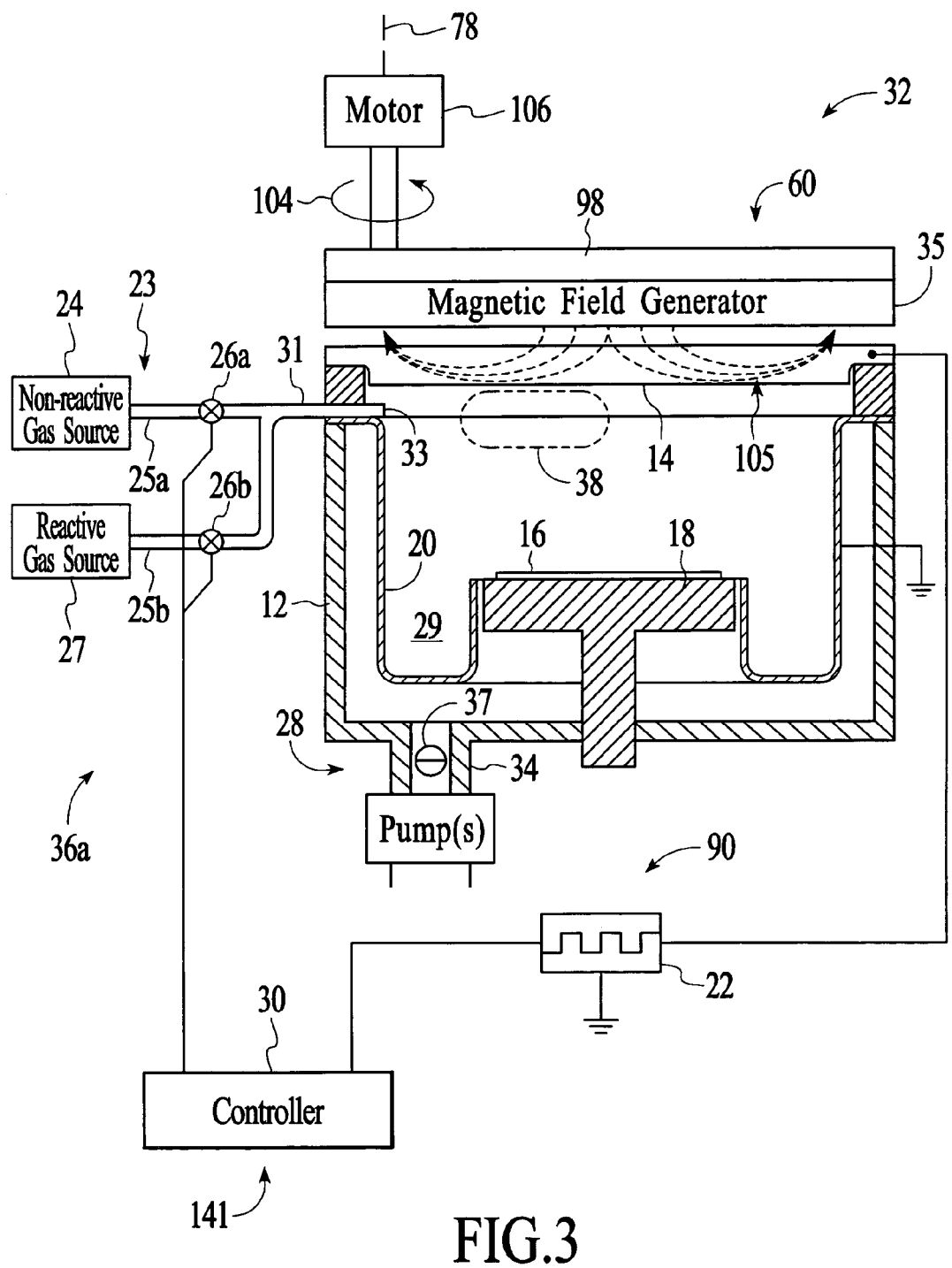
FIG. 3 is a schematic sectional view of an embodiment of a PVD chamber suitable for depositing a dielectric layer.
Figure 6:
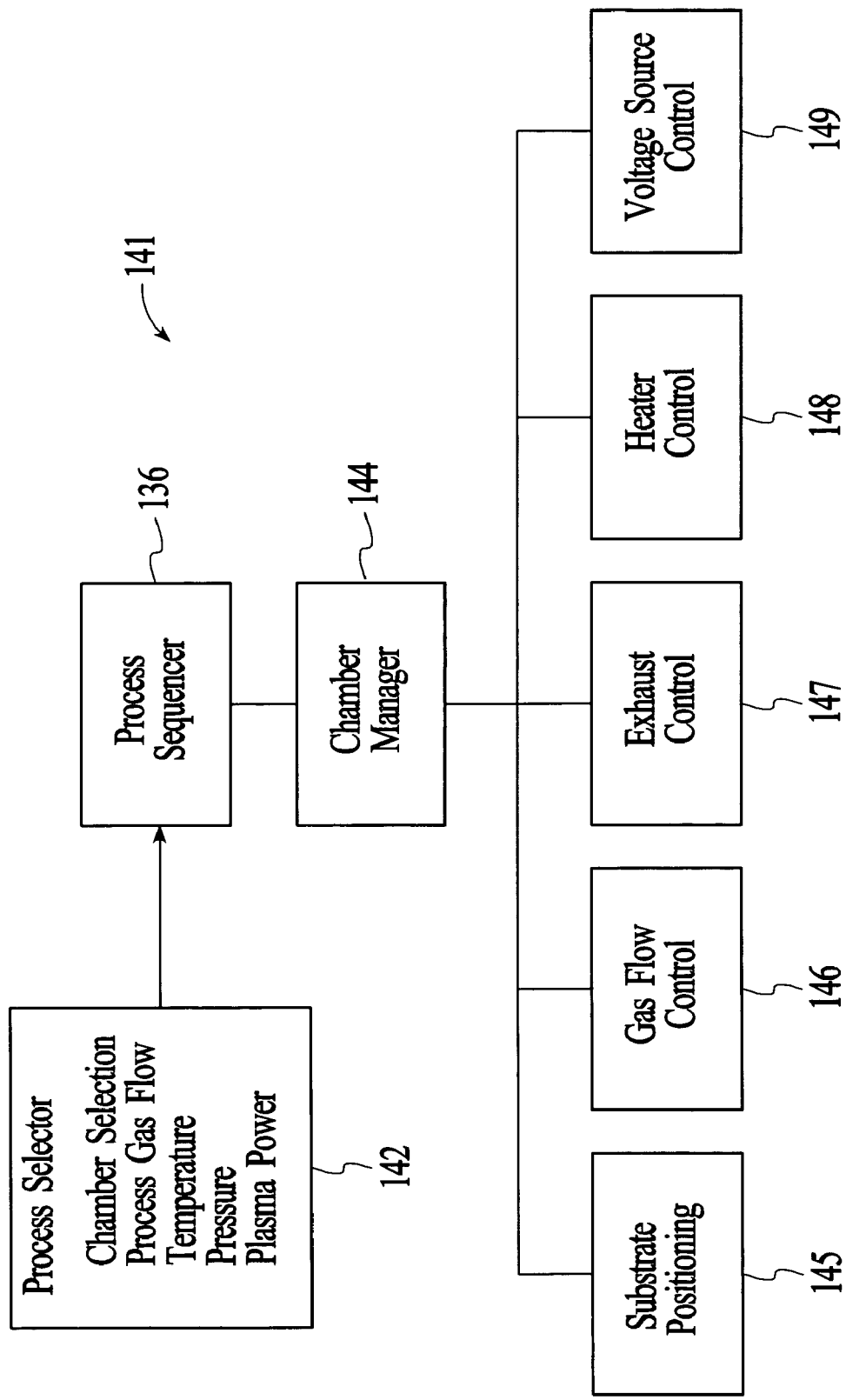

FIGS. 4a–d are schematic diagrams of embodiments of a pumping system to be used with the PVD chamber of FIG. 3;

FIG. 5 is a schematic diagram of a typical DC pulsing square wave applied to the target of the chamber of FIG. 3; and FIG. 6 is a simplified block diagram of a hierarchical control structure of an embodiment of a computer program capable of operating the PVD chamber of FIG. 3.

DESCRIPTION

Figure 1:
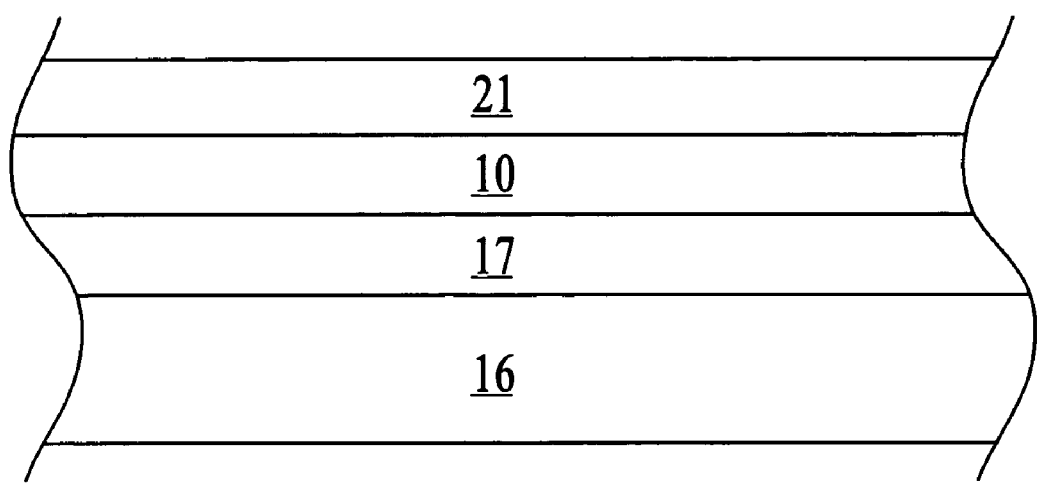
FIG. 1 is a schematic illustration of a dielectric layer formed on a substrate.

A dielectric film 10 according to the present invention can be formed on a substrate 16 which can include a wafer made of glass, polymer, metal, or semiconductor materials, such as for example, a monocrystalline silicon or gallium arsenide. As illustrated in FIG. 1, the dielectric film 10 may be formed on top of any number of underlying layers 17, including layers comprising materials such as metals, semiconductors, insulators, etc., previously formed on the substrate 16. The dielectric film 10 may also be formed directly on the substrate 16 and is a film suitable for the formation of any number of overlying layers 21.

Figure 2:
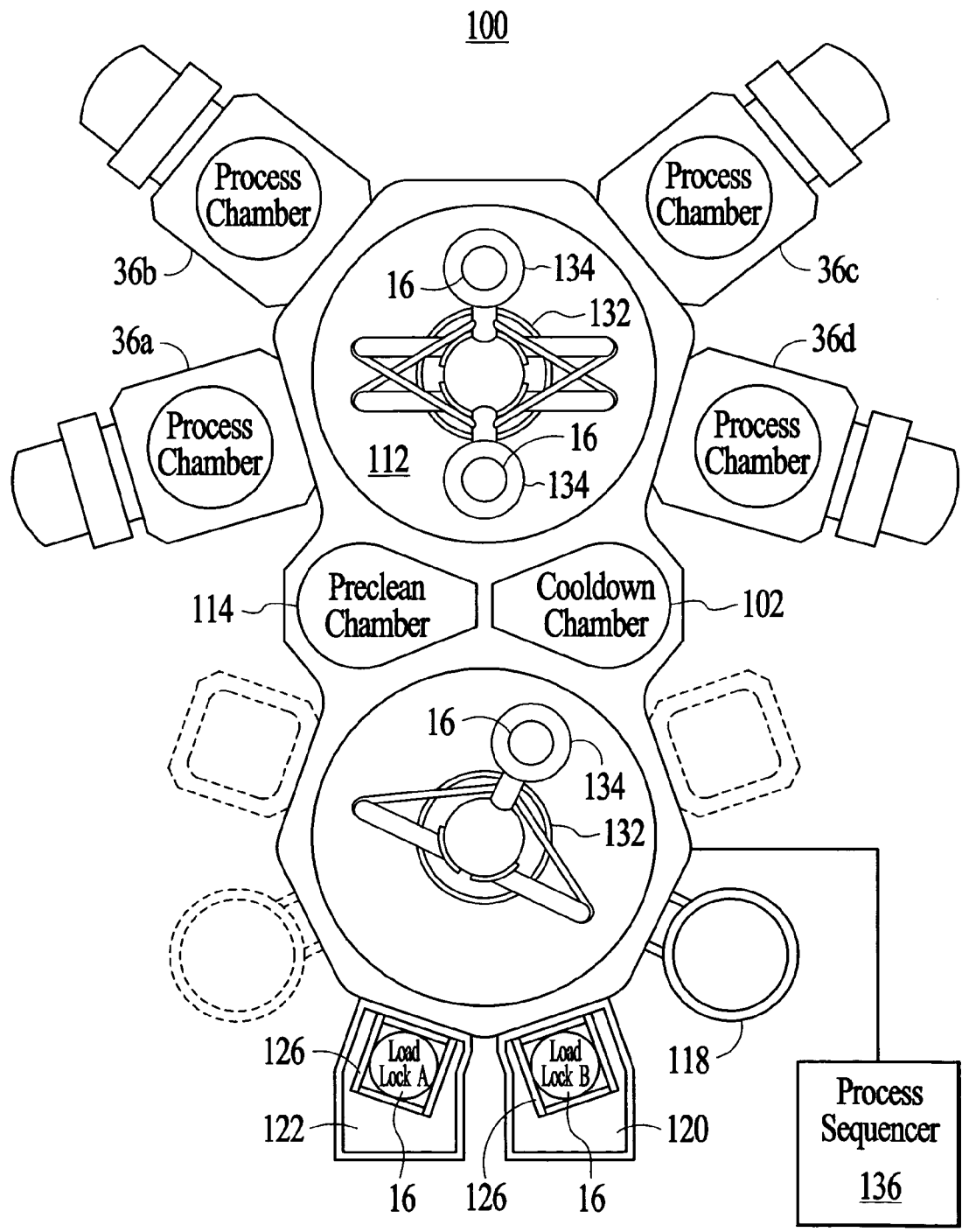
FIG. 2 is a schematic sectional top view of an embodiment of an apparatus comprising a multi-chamber platform having a number of interconnected PVD chambers mounted on the platform.

The dielectric film 10 is formed in a process chamber 36a that may be part of a multi-chamber platform 100, as shown in FIG. 2. The multi-chamber platform 100 may be, for example, an "ENDURA" system commercially available from Applied Materials, Santa Clara, Calif. The particular embodiment of the platform 100 shown herein, which is suitable for processing a planar silicon wafer substrate 16, is provided only to illustrate the invention, and should not be used to limit the scope of the invention. The multi-chamber platform 100 typically comprises a cluster of interconnected chambers 36a–d, 114, 102, 118 and a substrate transport comprising robot arm mechanisms 132 to transfer substrates 16 between the chambers 36a–d, 114, 102, 118. The robot arm mechanisms 132 comprise robot arms having blades 134 that support and carry the substrates 16. Load-lock chambers 120, 122 receive transport cassettes 126 containing the substrates 16. A substrate orienting and degassing chamber 118 is provided to orient the substrate 16 in preparation for processing, and to degas the substrate 16 to remove contaminants from the substrate 16 that could otherwise disrupt the high-vacuum environment in the process chambers 36a–d. A pre-clean chamber 114 may be used to clean the substrates 16 prior to any deposition step, and a cool down chamber 102 may be used to cool the substrates 16. A process sequencer 136 is provided to control the robot arm mechanisms 132, such as to order the sequence in which the robot arm mechanism 132 transfers the substrates 16 to and from the various chambers 36a–d, 114, 102, 118. Typically, the process sequencer 136 controls the robot arm mechanisms 132 to transfer a substrate 16 from one of the load lock chambers 120, 122 to the orienting and degassing chamber 118, then to the preclean chamber 114, then to one or more of the process chambers 36a–d, and afterwards to the cool down chamber 102.

The multi-chamber platform 100 has at least one PVD chamber 36a, as for example illustrated in FIG. 3, to sputter deposit the dielectric film 10 on the substrate 16. A substrate support 18 is provided for supporting the substrate 16 in the PVD chamber 36a. The substrate 16 is introduced into the chamber 36a through a substrate loading inlet (not shown) in a sidewall 45 of the chamber 36a and placed on the support 18. The support 18 can be lifted or lowered by support lift bellows (not shown) and a lift finger assembly (also not shown) can be used to lift and lower the substrate 16 onto the support 18 during transport of the substrate 16 into and out of the chamber 36a.

A sputtering gas supply 23 introduces sputtering gas into the chamber 36a to maintain the sputtering gas at a sub atmospheric pressure in the process zone. The sputtering gas is introduced into the chamber 36a through a gas inlet 33 that is connected via the gas inputs 25a,b to one or more gas sources 24, 27, respectively. One or more mass flow controllers 26a,b are used to control the flow rate of the individual gases—which may be premixed in a mixing manifold 31 prior to their introduction into the chamber 36a or which may be separately introduced into the chamber 36a. The sputtering gas supply 23 includes a non-reactive gas source 24, to supply a non-reactive component of the sputtering gas, that when energized into a plasma, energetically impinges upon and bombards the target 14 to sputter material, such as the titanium material, off from the target 14. In one version, the non-reactive component of the sputtering gas is argon. However, in other embodiments, the non reactive component of the sputtering gas can comprise different non-reactive gases, such as for example helium.

The sputtering gas supply 23 also includes a reactive gas source 27. The reactive gas source 27 supplies a reactive component of the sputtering gas, such as an oxygen-containing gas or a nitrogen-containing gas, that provides oxygen or nitrogen species in the chamber 36a to react with the sputtered target material to form the dielectric film 10 on the substrate 16. For example, the oxygen-containing gas can comprise oxygen. Besides oxygen, the oxygen-containing gas may also comprise ozone and other oxygen-containing gases. The nitrogen-containing gas can comprise, for example, nitrogen. The reactive component of the sputtering gas can also comprise a mixture of an oxygen-containing gas and a nitrogen-containing gas. Other compositions of the sputtering gas that include other reactive components or other types of non-reactive components, may also be used.

An exhaust system 28 controls the pressure of the sputtering gas in the chamber 36a and exhausts excess gas and by-product gases from the chamber 36a. The exhaust system 28 comprises an exhaust port 29 in the chamber 36a that is connected to an exhaust line 34 that leads to one or more exhaust pumps. A throttle valve 37 in the exhaust line 34 may be used to control the pressure of the sputtering gas in the chamber 36a. Typically, the pressure of the sputtering gas in the chamber 36a is set to sub-atmospheric levels, for example, from about 2 to about 10 mTorr.

The exhaust system comprises one or more pumps to pump gas out of the chamber 36a to generate a low pressure high vacuum environment in the chamber 36a. The one or more pumps of the exhaust system 28 are individually directed at different gases present in the process chamber 36a. It has been discovered that separate pumps may be necessary to adequately exhaust all the sputtering gas. For example, the reactive and non-reactive components of the sputtering gas present in the chamber 36a may be most effectively exhausted by different pumping mechanisms. Furthermore, different sub-components of the reactive and non-reactive components of the sputtering gas may also be most effectively exhausted by different pumps.

In one version, the exhaust system 28 comprises a pump 40 based on condensation of gases on cooled surfaces. For example, in one embodiment, the exhaust system 28 comprises a pump 40 having a cooled surface external to the process zone on which sputtering gases are condensed. Condensing sputtering gases on cooled surfaces external to the process zone is advantageous for certain sputtering gases, for example, this mechanism may be most appropriate for removing relatively heavier non-reactive gases, such as argon for example, from the process chamber because these gases are less suited to other types of pumps. In one version, the pump 40 based on condensation of gases on cooled surfaces comprises a cryogenic pump (cryo-pump) 40a. The cryo-pump 40a comprises a pump housing, surfaces inside the housing capable of being cooled, a means to cool the surfaces, a gas inlet and a gas outlet.

The exhaust system 28 may also comprise a pump 41 based on the movement of rotors. For example, in one embodiment, the exhaust system 28 comprises a pump 41 having one or more rotors that move relative to stators, the rotors and stators having surfaces exposed to the gases being pumped. The motion of the rotors causes gas molecules to impinge upon the surfaces of the rotors and stators and thus receive a momentum increase in a pumping direction. A pump 41 based on the movement of rotors is advantageous to exhaust relatively lighter gases. For example, a greater velocity is imparted to a relatively lighter gas molecule for a given momentum increase. Additionally, the pump 41 based on the movement of rotors may be more effective at removal of oxygen-containing gasses in comparison to the pump 40 based on condensation on cooled surfaces. Oxygen-containing gases may not be well-suited to condensation on a cooled surface because there may be a danger of combustion pertaining to the formation of $O_2$ and $O_3$ on cooled surfaces. Also, removal of oxygen at relatively low pressures, including pressures that may exist during processing of substrates, may reduce the efficiency of the cryo-pump 40a. In one embodiment, the pump 41 comprising moving rotors is a turbomolecular pump (turbo-pump) 41a comprising one or more stages of rotors and stators having surfaces exposed to the gas being pumped, a means of moving the rotors, a gas inlet and an a gas outlet.

The exhaust system 28 may also comprise a water vapor condenser 42. The water vapor condenser 42 is provided to condense and collect water vapor formed in the chamber 36a. A suitable water vapor condenser 42 comprises a helix that serves as a cold sink to condense the water vapor in the helix thereby avoiding damage to the downstream pumps. Water vapor is formed in the chamber environment from the combination of residual hydrogen species and oxygen species from the oxygen-containing gas. Water vapor may be harmful to downstream pumps such as the cryo-pump 40a.

The exhaust system 28 may also comprise a roughing pump 43 and a scrubber system. The roughing pump 43 may be a rotary vane pump that is downstream of the other pumps, and is capable of achieving a minimum vacuum of about 10 mTorr. The roughing pump 43 is used to quickly eliminate gases from the chamber to achieve an intermediate pressure, and from there, low pressure pumps such as the turbo-pump 41a and cryo-pump 40a can proceed to evacuate the chamber 36a to even lower pressures. Optionally, a scrubber system (not shown) may be present for scrubbing the byproduct gases formed in the chamber 36a.

Figure 4:
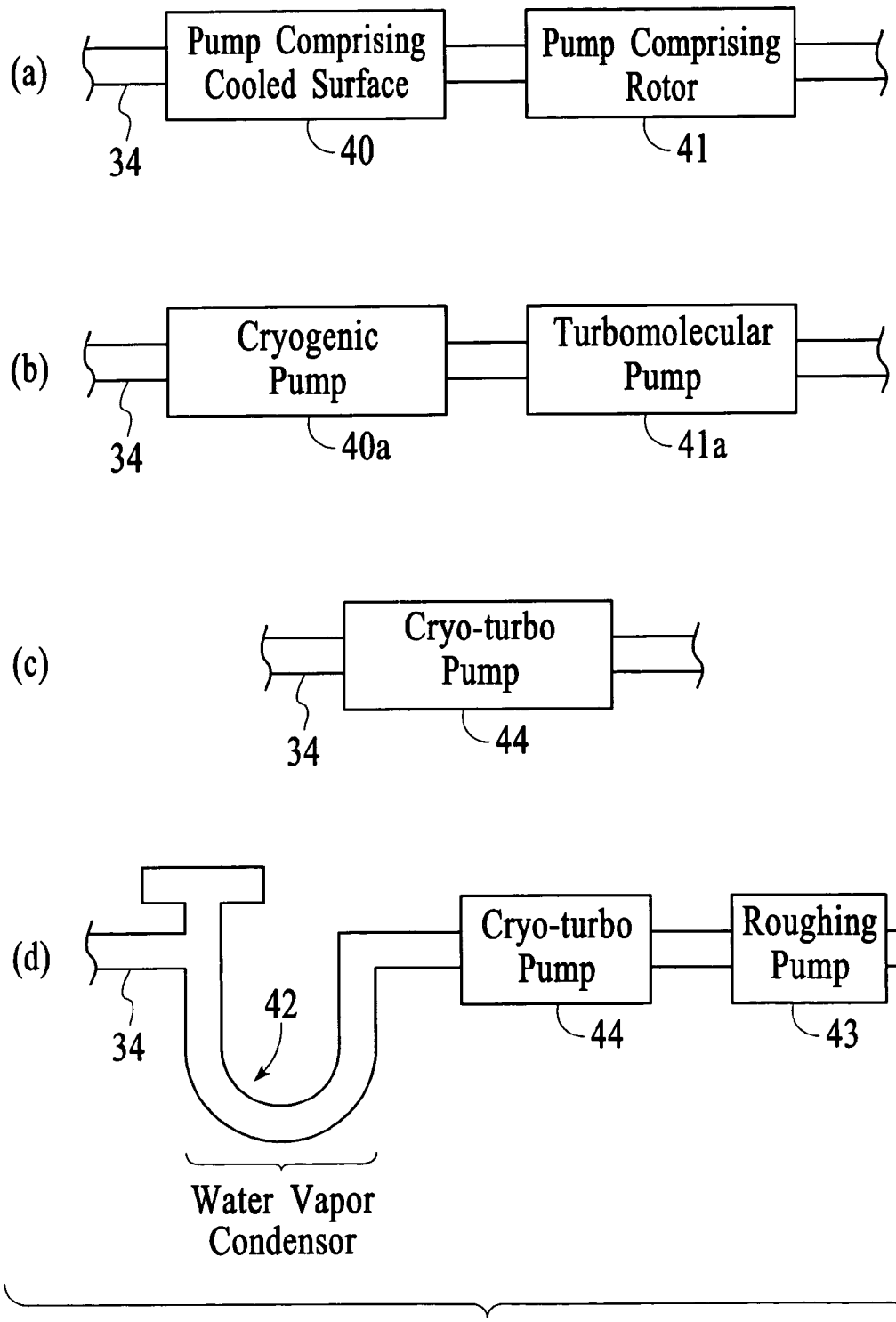

The exhaust system 28 may comprise one or more of any of these pumps arranged in series, parallel or some combination of series and parallel. For example, in one version, as shown in FIG. 4a, the exhaust line 34 is connected to a pump 40 comprising a cooled surface external to the process zone that is upstream of a pump 41 comprising moving rotors. In one embodiment of this version, as shown in FIG. 4b, the exhaust line 34 is connected to a cryo-pump 40a that is upstream of a turbo-pump 41a. In another embodiment, as shown in FIG. 4c, a single pump can combine these two types of pumps, that is, for example, a single pump can eliminate gases using pumping mechanisms involving both moving rotors and condensation on cooled surfaces. This type of combination pump is also known as a cryo-turbo pump 44. In another version, as shown in FIG. 4d, the exhaust line 34 is connected to a water vapor condensor 42 that is upstream of a cryo-turbo pump 44 and a roughing pump 43. Alternately, the sequential order of the pumps can be reversed in any of these versions. Furthermore, in any of these versions, these pumps can act in parallel, connected to the chamber 36a by either separate exhaust lines 34 or separate exhaust lines 34 in combination with separate exhaust ports 29.

The pressure created in the chamber 36a is a combination of the partial pressures created by each pump connected to the chamber by the exhaust line. The turbomolecular pump 41a, cryo-pump 40a, and cryo-turbo pumps 44 can typically combine to exhaust the gas at a rate of about 2000 liters/second to create pressures in the chamber of about $1 \times 10^{-9}$ to about $8 \times 10^{-8}$ Torr.

Pumps as described above are commercially available from a number of sources. For example, suitable turbo-pumps 41a include the ATP series of turbo-pumps, available from Alcatel Corporation, located in Hingham, Mass., U.S.A. Suitable cryo-pumps 40a include the On-Board series of cryo-pumps, available from Helix Technology Corporation, located in Mansfield, Mass., U.S.A. A suitable cryo-turbo pump 44 is the Turbo Plus pump, also available from Helix Technology Corporation. A suitable water condensor 42 is integrated into the Turbo Plus pump. A suitable roughing pump 43 is the IPUP A100L, available from Alcatel Corporation. However, other pumps from other commercial sources may also be suitable.

The PVD chamber 36a further comprises a sputtering target 14 facing the substrate 16. A collimator (not shown) may be mounted between the target 14 and the substrate support 18 if desired. The PVD chamber 36a may also have a shield 20 to protect a wall 12 of the chamber 36a from sputtered material, and typically, to also serve as an anode grounding plane. The shield 20 is electrically floating or grounded. The target 14 is electrically isolated from the chamber 36a and is connected to a voltage source, such as a pulsed DC power source 22, but which may also be other types of voltage sources. In one version, the pulsed DC power source 22, target 14, and shield 20 operate as a gas energizer 90 that is capable of energizing the sputtering gas to sputter material from the plasma. The pulsed DC power source 22 applies a pulsed DC voltage to the target 14 relative to the shield 20. The electric field generated in the chamber 36a from the voltage applied to the sputtering target 14 energizes the sputtering gas to form a plasma that sputters off the target material.

In one version, the target 14 comprises tantalum. In other versions, the target 14 may comprise titanium, aluminum, indium-tin oxide, hafnium and silicon. All these target materials generate useful dielectric films 10 according to the present invention. For example, different dielectric films 10 can be formed using different combinations of target material and reactive gas. In one embodiment, a dielectric film 10 comprising tantalum oxide is formed using a tantalum target 14 and an oxygen-containing reactive gas. In other embodiments, hafnium oxide, aluminum oxide, indium-tin oxide and silicon oxide films 10 can be formed by using targets 14 comprising hafnium, aluminum, indium-tin oxide and silicon, respectively, in combination with an oxygen-containing gas. In addition, a reactive gas such as nitrogen can be used with these target materials to form dielectric films 10 comprising aluminum nitride and silicon nitride.

The pulsed DC power source 22 applies a pulsed DC (direct current) voltage to the target 14. The pulsed DC voltage may be oscillated between negative and positive states. In one version, the pulsed DC voltage is pulsed between "on" and "off" states, as for example, shown in FIG. 5. A suitable pulsing frequency may be such that the DC voltage is off for at least about 5% of the time of each pulse cycle which is the total time period of one DC pulse. Preferably, the DC voltage is off for less than about 50% of the time of each pulse cycle, and more preferably for about 30% of the time of each pulse cycle. For example, for a total individual pulse cycle time of 10 microseconds, the pulsed DC voltage may be maintained "on" for about 7 microseconds and "off" for about 3 microseconds. The pulsed DC voltage may be pulsed at a pulsing frequency of at least about 50 kHz, and more preferably less than about 300 kHz, and most preferably about 100 kHz. A suitable DC voltage level is from about 200 to about 800 Volts.

Elemental material sputtered from the target 14 combines with a reactive species in the chamber 36a to form a dielectric film on the substrate 16. It is believed that the pulsed DC voltage applied to the target 14 results in charge dissipation from a dielectric layer that is formed on the surface of the target 14, as a result of exposure of the target material, such as tantalum, to the reactive gas, such as an oxygen-containing gas. The tantalum of the target 14 and the oxygen-containing gas react to form a thin insulative film of tantalum oxide on the target surface. The insulative film does not allow accumulated charge to dissipate over time when exposed to the plasma environment containing charged ions and other species. The pulsed DC voltage alleviates this problem by maintaining "on" and "off" states during each pulse cycle. During the off period, the charge accumulated on the insulator layer that is formed on the target surface has enough time to be discharged. Hence, such charge accumulation is reduced and prevented from impeding the sputtering process. Absent the "off" portion of the pulse cycle, the insulator layer built up on the target surface and the resultant charge accumulation gradually reduces the deposition rate and may eventually even cause the plasma to be extinguished.

The chamber 36a further comprises a magnetron 32 comprising a magnetic field generator 35 that generates a magnetic field 105 near the target 14 of the chamber 36a to increase an ion density in a high-density plasma region 38 adjacent to the target 14 to improve the sputtering of the target material. In addition, an improved magnetron 32 may be used to allow sustained self-sputtering of copper or sputtering of aluminum, titanium, or other metals; while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. The magnetic field 105 extends through the substantially non-magnetic target 14 into the vacuum chamber 36a. In one version, the magnetron 32 generates a semi-toroidal magnetic field at the target 14. In one embodiment, the magnetron 32 extends horizontally from approximately a central point on the target 14 to the edge of a usable area of the target 14. In one version, the magnetron 32 comprises a motor 106 to rotate the magnetron 32 about a rotation axis 78. The motor 106 is typically attached to a magnetic yoke 98 of the magnetron 32 by a shaft 104 that extends along the rotation axis 78.

In one embodiment, the sputtering process is used to deposit a dielectric film 10 that is non-stoichiometric, for example, $M_xO_y$, where M is a metal and O is oxygen or $M_xN_y$, where M is a metal and N is nitrogen. A stoichiometric compound has component elements present in the exact proportions indicated by a formula which is generally determined by stable combinations of oxidation states of the constituent elements. In the non-stoichiometric film, the x and y values are selected to be integer or non-integer values that do not correspond to the stable stoichiometric state of the dielectric film compound, and consequently, result in a deposited dielectric film 10 that is non-stoichiometric. For example, in the deposition of tantalum oxide films, the method may be used to deposit a tantalum oxide film having a chemical composition according to the formula $Ta_xO_y$, with x moles of tantalum to y moles of oxygen. For example, a non-stoichiometric tantalum oxide film 10 can have the formula TaO where x and y are both integers and equal to 1; or even $Ta_{1.33}O_{3.33}$, in which the x and y values are non-integer values that selected by setting a ratio of non-reactive to reactive gas that provides the desired molar ratio of 1.33:3.33 in the deposited film compound. Non-stoichiometric compounds can be generated by, for example, packing interstitial atoms between molecules of the lattice of the dielectric compound, or by forming a combination of different phases. The non-stoichiometric compounds can be advantageous because their properties are tunable or selectable based on the application and are not limited to one set of properties.

In another example, the dielectric film 10 can be deposited which has a specific selectable oxidation state of the metal element of the dielectric film that is not the most commonly used oxidation state. For example, commonly used tantalum oxide has the chemical formula $Ta_2O_5$, where x is 2 and y is 5, and the oxidation state of tantalum is +5. The instant tantalum oxide deposited film would be a $Ta_xO_y$ film in which the oxidation state of tantalum is other than +5, for example, less than +5, such as an oxidation state of +4, +2, or other intermediate non-integer values. These different oxidation states of tantalum can possess unique dielectric properties that are selected for particular applications. For example, certain ratios of x and y in the deposited $Ta_xO_y$ film can be less susceptible to current leakage at higher frequencies of current, consequently, and advantageously, having tunable dielectric film properties that can be tailored for the frequency applied in the particular integrated circuit chip.

While a constant sputtering gas composition may be used for the sputtering process, the sputtering gas composition can also be varied during the sputtering process. For example, a variable sputtering process may be used to deposit dielectric films 10 having a number of different chemical compositions that vary continuously or in steps through the thickness of the film 10. In one version, the sputtering gas composition ratio can be varied to deposit multiple layers of dielectric films each with a different ratio of constituent elements. The dielectric and other properties of the deposited film 10, for example, dielectric constant, index of refraction, Young's Modulus, and extinction coefficient, are all dependent upon the chemical composition of the dielectric material. Thus, this method can be used to create multi-layered dielectric films 10 that have properties that vary through the thickness of the film 10. Such films 10 can be tailored to specific applications in which certain properties are desirable.

In one version, this method is used to deposit a tantalum oxide dielectric film 10 having a chemical composition that varies through the thickness of the film 10. The resultant tantalum oxide dielectric film 10 has properties that vary through the thickness of the film 10 and is useful, for example, to form protective layers for micro-electrical-mechanical system (MEMS) devices. MEMS devices are electrical and mechanical devices on a very small scale, for example on the order of microns and smaller. These devices operate on mechanical, electrical, thermal and chemical principals, and thus are sensitive to their environmental conditions and usually require a protective layer. The protective layer must provide adequate protection without adversely affecting the underlying MEMS device. Tantalum oxide is used as a protective layer because it has a good resistance to degradation by chemical interaction with, for example, oxygen and nitrogen. One concern is that the protective layer does not impart excessive mechanical stress on the device, which could impact its operation. A variable composition tantalum oxide protective layer for MEMS device is advantageous because the varying composition of the protective layer can be used to create a protective layer that has varying internal stress levels due to its varying composition. This can be used to create a protective layer that presents reduced mechanical stresses to the underlying MEMS devices. The variable composition of the protective layer also creates internal stress levels that can be tailored to help the layer avoid delamination or peeling off from the underlying MEMS device.

This technique can be used to form a dielectric film 10 having a chemical composition that varies continuously through the thickness of the film 10. In one version of this method, a sputtering gas is initially introduced into the chamber 36a and energized to sputter off sputtering material from the sputtering target 14. During the sputtering process, the composition of the sputtering gas is changed in a continuous fashion to change the chemical composition of the dielectric film 10 being deposited. For example, during the sputtering process, the composition of the sputtering gas can be changed by adjusting the mass flow controllers 26a,b. In one version, the mass flow controllers 26a,b can be continuously adjusted during the sputtering process to alter the volumetric flow rates of both the reactive and non-reactive components of the sputtering gasses. Thus, during the process according to this method, the volumetric flow ratio of the non-reactive component of the sputtering gas to the reactive component of the sputtering gas changes continuously. For example, in one embodiment of the method, initial and final volumetric flow ratios of the non-reactive component of the sputtering gas to the reactive component of the sputtering gas are selected, the process is begun using the initial volumetric flow ratio, and the mass flow controllers 26a,b are continuously adjusted to provide a linear variation of the volumetric flow ratio from the initial value to the final value, producing a dielectric film 10 with a chemical composition that continuously varies in a substantially linear manner through its thickness. In another embodiment of the method, the volumetric flow ratio can be continuously varied in a non-linear fashion to produce a dielectric film 10 having a chemical composition that continuously varies in a substantially non-linear manner through the thickness of the film 10.

In one example, a dielectric film 10, such as one comprising tantalum oxide, having a variable composition may be formed by varying the composition of the sputtering gas from the first volumetric flow ratio of reactive to non-reactive gas to a second volumetric flow ratio continuously over the course of the process. For example, the oxygen (reactive gas) to argon (non-reactive gas) can be changed during deposition of tantalum from a tantalum target. In one instance, a first sputtering gas having a composition of 30 sccm oxygen and 55 sccm argon, can be used to initially deposit a tantalum oxide film 10 on the substrate 16, and thereafter, the composition of the sputtering gas may be continuously and gradually changed, or in step-wise manner, to a final composition comprising 70 sccm oxygen and 15 sccm argon. The resultant dielectric film 10 has a chemical composition that varies continuously through the thickness of the film 10, or multiple layers, respectively.

In the same manner, a dielectric film 10 having a chemical composition that varies in discrete steps through the thickness of the film 10 can also be formed. In this version, in a first stage, a first sputtering gas comprising a first composition is initially introduced into the chamber 36a and energized to sputter off sputtering material from the sputtering target 14. The sputtering material reacts with the first sputtering gas to deposit a first portion of the dielectric film 10 on the substrate 16. The composition of the first portion of the dielectric film 10 depends on the amount of sputtered material as well as the composition of the sputtering gas. When the first sputtering gas comprises reactive and non-reactive components of the sputtering gases in a first volumetric flow ratio, the first portion deposited on the substrate 16 has a corresponding first composition with a resultant first property. After a desired thickness of the first portion of the dielectric film 10 is deposited on the substrate 16, in a second stage, the composition of the first sputtering gas is changed to a second sputtering gas composition, for example, to a composition having a second volumetric flow ratio of the reactive and non-reactive components of the sputtering gas. The second sputtering gas is energized to sputter off additional sputtering material from the sputtering target 14 which reacts with the second sputtering gas composition to deposit a second portion of the dielectric film 10 on the substrate 16. The second portion has a slightly different composition or other physical or chemical property than the first portion. The transition from the first portion of the dielectric film 10 to the second portion of the dielectric film 10 can be relatively abrupt. Third, fourth, and other stages can then be performed to replicate the initial two stages or with different process conditions. In this manner, the compositions of the first and second portions of the dielectric film 10 may be tailored to provide a dielectric film 10 having a chemical composition that varies in discrete steps through the thickness of the film 10. Furthermore, additional portions of the dielectric film 10 can be deposited having different chemical compositions. For example, in one version, the dielectric film 10 can have a chemical composition that varies over a several, a dozen or hundreds of discrete steps.

In one example, a dielectric film 10 comprising tantalum oxide having a composition varying in discrete steps may be formed. For example, a first sputtering gas having a composition of 30 sccm oxygen and 55 sccm argon may initially be used to deposit a first portion of the tantalum oxide film 10 on the substrate 16. Thereafter, the composition of the sputtering gas may be changed to a second composition comprising 70 sccm oxygen and 15 sccm argon, to deposit a second portion of the titanium oxide film 10 on the substrate 16. In one embodiment, this process can be continued for many discrete steps by altering the composition of oxygen by, for example, 10 sccm steps and the composition of argon by, for example, 5 sccm steps. The resultant dielectric film 10 has a plurality of discretely varying chemical compositions.

While the dielectric film 10 is described referring to an exemplary process of the deposition of tantalum oxide, it should be understood that this process may be used to deposit other materials, such as for example, dielectric films 10 comprising aluminum nitride used as hardmask layers, dielectric films 10 comprising indium tin oxide used as transparent conducting layers, dielectric films 10 comprising hafnium oxide used as high-k dielectric layers in metal gate transistors, etc. Thus, the scope of the present invention should not be limited to the illustrative embodiment of the tantalum oxide dielectric film 10.

The PVD process of the present invention may be implemented using a computer program product 141 that includes the process sequencer 136 and that runs on a controller 30, as shown in FIG. 5, comprising a central processing unit (CPU) interconnected to a memory system with peripheral control components, such as for example a 68400 microprocessor, commercially available from Synergy Microsystems, California. The computer program code can be written in any conventional computer readable programming language, such as for example, assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

A user enters a process set and process chamber number into a process selector program code 142. The process sets are predetermined sets of process parameters necessary to carry out specified processes in a specific process chamber, and are identified by predefined set numbers. The process parameters relate to process conditions such as, for example, process gas composition and flow rates, temperature, pressure, gas energizing process conditions such as non-pulsed or pulsed DC power levels and magnetic field power levels, cooling gas pressure, and chamber wall temperature.

The process sequencer 136 comprises program code for accepting the identified process chamber 36 and set of process parameters from the process selector program code 142, and for controlling operation of the various process chambers 36*a–d*. Multiple users can enter process set numbers and process chamber numbers, or a user can enter multiple process set numbers and process chamber numbers, so the process sequencer 136 operates to schedule the selected processes in the desired sequence. Preferably, the process sequencer 136 includes a program code to perform the steps of (i) monitoring the operation of the process chambers 36*a–d* to determine if the chambers 36*a–d* are being used, (ii) determining what processes are being carried out in the chambers 36*a–d* being used, and (iii) executing the desired process based on availability of a particular process chamber 36 and type of process to be carried out. Conventional methods of monitoring the process chambers 36*a–d* can be used, such as polling. When scheduling which process is to be executed, the process sequencer 136 can be designed to take into consideration the present condition of the process chamber 36 being used in comparison with the desired process conditions for a selected process, or the "age" of each particular user entered request, or any other relevant factor a system programmer desires to include for determining scheduling priorities.

Once the process sequencer 136 determines which process chamber and process set combination is going to be executed next, the sequencer program code 143 causes execution of the process set by passing the particular process set parameters to a chamber manager program code 144 which controls multiple processing tasks in different process chambers 36*a–d* according to the process set determined by the process sequencer 136. For example, the chamber manager program code 144 comprises program code for controlling PVD process operations, within the described process chamber 36*a*. The chamber manager program code 144 also controls execution of various chamber component program codes or program code modules, which control operation of the chamber components necessary to carry out the selected process set. Examples of chamber component program codes are a substrate positioning program code 145, gas flow control program code 146, exhaust control program code 147, heater control program code 148, and voltage source control program code 149. Those having ordinary skill in the art would readily recognize that other chamber control program codes can be included depending on what processes are desired to be performed in the process chamber 36*a*.

In operation, the chamber manager program code 144 selectively schedules or calls the process component program codes in accordance with the particular process set being executed. The chamber manager program code 144 schedules the process component program codes similarly to how the sequencer program code 143 schedules which process chamber 36*a–d* and process set is to be executed next. Typically, the chamber manager program code 144 includes steps of monitoring the various chamber components, determining which components need to be operated based on the process parameters for the process set to be executed, and causing execution of a chamber component program code responsive to the monitoring and determining steps.

Operation of particular chamber component program codes will now be described. The substrate positioning program code 145 comprises program code for controlling chamber components that are used to transfer a substrate 16 onto the substrate support 18, and optionally, to lift the substrate 16 to a desired height in the chamber 36 to control the spacing between the substrate 16 and a target. When a substrate 16 is transferred into the process chamber 36*a*, the substrate support 18 is lowered to receive the substrate 16, and thereafter, the support 18 is raised to the desired height in the chamber 36*a*. The substrate positioning program code 145 controls movement of the support 18 in response to process set parameters related to the support height that are transferred from the chamber manager program code 144.

The gas flow program code 146 is for controlling process gas composition and flow rates. Generally, the gas conduits 34 for each of the process gases, include safety shut-off valves (not shown) that can be used to automatically or manually shut off the flow of process gas into the chamber 36a. When toxic gases are used in the process, the several safety shut-off valves are positioned on each gas conduit 34 in conventional configurations. The gas flow program code 146 controls an open/close position of the safety shut-off valves, and also ramps up/down the mass flow controllers to obtain the desired gas flow rate. The gas flow program code 146 is invoked by the chamber manager program code 144, as are all chamber component program codes, and receives from the chamber manager program code, the process parameters that are related to desired gas flow rates. Typically, the gas flow program code 146 operates by repeatedly reading the necessary mass flow controllers, comparing the readings to the desired flow rates received from the chamber manager program code 144, and changing the flow rates as necessary. Furthermore, the gas flow program code 146 includes steps for monitoring the gas flow rates for unsafe rates, and activating the safety shut-off valves when an unsafe condition is detected. In one version, the gas flow program code 146 operates the mass flow controllers to control the gas flow rates to provide a sputtering gas comprising first volumetric flow ratio of oxygen-containing gas to argon for a first time period, and a second volumetric flow ratio of oxygen-containing gas to argon for a second time period.

When the exhaust control program code 147 is invoked, a desired pressure level is received as a parameter from the chamber manager program code 144. The exhaust control program code 147 operates to measure the pressure in the chamber 36a by reading one or more conventional pressure nanometers (not shown) connected to the chamber 36a, compare the measure value(s) to the target pressure, obtain PID (proportional, integral, and differential) values from a stored pressure table corresponding to the target pressure, and adjust a throttle valve 37 of the exhaust 28 according to the PID values obtained from the pressure table. Alternatively, the pressure in the chamber 36a may be adjusted by regulating the opening size of the throttle valve 37 in the exhaust conduit 34 of the exhaust system 28.

The optional heater control program code 148 comprises program code for controlling the temperature of an optional heater (not shown) that may be used to heat the substrate 16. The heater control program code 148 measures temperature by measuring voltage output of a thermocouple (not shown) located in the support 18, compares the measured temperature to the set-point temperature, and increases or decreases current applied to the heater to obtain the desired ramp rate or set-point temperature. The temperature is obtained from the measured voltage by looking up the corresponding temperature in a stored conversion table, or by calculating the temperature using a fourth order polynomial. When radiant lamps are used as the heater, the heater control program code 148 gradually controls a ramp up/down of current applied to the lamp that increases the life and reliability of the lamp. Additionally, a built-in fail-safe mode can be included to detect process safety compliance, and to shut down operation of the heater if the process chamber 36a is not properly set up.

The voltage source program code 149 comprises program code for controlling a voltage source, such as the pulsed DC voltage source, to energize the sputtering gas in the chamber 36a to sputter material from the target 14. For example, the program code 149 may set the pulsed DC voltage levels applied to the target 14 and may also set the electrical state of the sidewalls 20 in the chamber 36a. Similarly to the previously described chamber component program codes, the program code 149 is invoked by the chamber manager program code 144. In operation, the program code 149 includes steps for reading both "forward" power applied to the target 14, and "reflected" power flowing through the chamber 36a. An excessively high reflected power reading indicates that the plasma has not been ignited, and the program code 149 restarts or shuts down the process. The read power levels are compared against target levels, and the current is adjusted to control the plasma.

The present invention has been described in considerable detail with reference to certain preferred versions thereof. However, other versions are possible. For example, the present invention can be used to deposit many different materials on the substrate, and is not limited to processing of semiconductor substrates. Therefore the spirit and scope of the appended claims should not be limited to the description of the preferred versions contained herein.

What is claimed is:

1. A method of depositing a non-stoichiometric tantalum oxide film on a substrate, the method comprising:
    (a) placing a substrate in a process zone to face a target comprising tantalum;
    (b) applying a pulsed DC voltage to the tantalum target;
    (c) introducing a sputtering gas to the process zone, the sputtering gas comprising a non-reactive component and an oxygen-containing component in a volumetric flow ratio that is selected to deposit a non-stoichiometric $Ta_xO_y$ film having a ratio of x moles of tantalum to y moles of oxygen; and
    (d) removing the sputtering gas from the process zone by:
        (i) condensing at least some of the non-reactive component on a cooled surface external to the process zone; and
        (ii) exhausting at least some of the oxygen-containing component from the process zone with moving rotors.

2. A method according to claim 1 wherein step (c) comprises changing the ratio of the non-reactive component to the oxygen-containing component from a first ratio to a second ratio to vary the x and y values through the thickness of the deposited film.

3. A method according to claim 2 comprising changing the ratio by a plurality of discrete steps through the thickness of the deposited film.

4. A method according to claim 1 wherein (d) comprises removing the sputtering gas from the process zone by a cryo-turbo pump.

5. A method according to claim 1 wherein the non-reactive component of the sputtering gas comprises argon and the oxygen-containing component of the sputtering gas is oxygen.

6. A method according to claim 1 wherein (b) comprises applying a pulsed DC voltage that is pulsed on and off, the on voltage having a value of about 200 V to about 800 V.

7. A method according to claim 1 wherein (b) comprises applying a pulsed DC voltage that is pulsed so that the DC voltage is off for at least about 30% of the time of each pulse cycle and that is pulsed at a frequency of about 100 kHz.

8. A method according to claim 1 wherein (b) comprises applying a pulsed DC voltage at a power level of about 10 kW.

9. A method of depositing a tantalum oxide film on a substrate, the method comprising:
- (a) placing a substrate in a process zone to face a target comprising tantalum;
- (b) applying a pulsed DC voltage to the tantalum target, the DC voltage being pulsed on and off, the on voltage having a value of about 200 V to about 800 V, the DC voltage being off for at least about 30% of the time of each pulse cycle, the pulse frequency of the DC voltage being about 100 kHz;
- (c) introducing into the process zone, a sputtering gas comprising argon and oxygen in a ratio selected to deposit a $Ta_xO_y$ film having a ratio of x moles of tantalum to y moles of oxygen; and
- (d) removing the sputtering gas from the process zone.

10. A method according to claim 9 wherein (d) comprises:
- (i) condensing at least some of the argon on a cooled surface external to the process zone; and
- (ii) exhausting at least some of the oxygen from the process zone with moving rotors.

11. A method according to claim 9 wherein the deposited tantalum oxide film is a non-stoichiometric tantalum oxide film.

12. A method according to claim 9 comprising changing the ratio of argon to oxygen in the sputtering gas to vary the x and y values through the thickness of the film.

13. A method according to claim 10 comprising changing the ratio of argon to oxygen in the sputtering gas in discrete steps.

14. A method according to claim 9 wherein (d) comprises removing the sputtering gas with a cryo-turbo pump.

15. A method of depositing a non-stoichiometric dielectric film on a substrate, the method comprising:
- (a) placing a substrate in a process zone to face a target;
- (b) applying a pulsed DC voltage to the target;
- (c) introducing a sputtering gas comprising a non-reactive component and a reactive component to the process zone in a ratio that is selected to deposit a non-stoichiometric dielectric film; and
- (d) removing the sputtering gas from the process zone by:
  - (i) condensing at least some of the non-reactive component on a cooled surface external to the process zone; and
  - (ii) exhausting at least some of the reactive component from the process zone with moving rotors.

16. A method according to claim 15 comprising changing the ratio of the non-reactive component to the reactive component of the sputtering gas to vary the ratio of elements in the deposited non-stoichiometric dielectric film through the thickness of the film.

17. A method according to claim 15 wherein (d) comprises using a cryo-turbo pump.

18. A method according to claim 15 wherein (i) the non-reactive component of the process gas comprises argon, and (ii) the reactive component of the sputtering gas comprises oxygen-containing gas or a nitrogen-containing gas.

19. A method according to claim 15 wherein the target is tantalum, aluminum, hafnium, indium-tin oxide, or silicon.

20. A method according to claim 15 wherein (b) comprises applying a pulsed DC voltage that is pulsed on and off, the on voltage having a value of about 200 V to about 800 V.

21. A method according to claim 15 wherein (b) comprises applying a pulsed DC voltage that is pulsed so that the DC voltage is off for at least about 30% of the time of each pulse cycle and that is pulsed at a frequency of about 100 kHz.

22. A method according to claim 15 wherein (b) comprises applying a pulsed DC voltage at a power level of about 10 kW.

23. A method of depositing a tantalum oxide film on a substrate, the method comprising:
- (a) placing a substrate in a process zone to face a target comprising tantalum;
- (b) applying a pulsed DC voltage to the tantalum target;
- (c) introducing a sputtering gas to the process zone, the sputtering gas comprising a non-reactive component and an oxygen-containing component in a volumetric flow ratio that is selected to deposit a $Ta_xO_y$ film having a ratio of x moles of tantalum to y moles of oxygen such that the oxidation state of tantalum is less than +5; and
- (d) removing the sputtering gas from the process zone by:
  - (i) condensing at least some of the non-reactive component on a cooled surface external to the process zone; and
  - (ii) exhausting at least some of the oxygen-containing component from the process zone with moving rotors.

24. A method according to claim 23 wherein step (c) comprises changing the ratio of the non-reactive component to the oxygen-containing component from a first ratio to a second ratio to vary the x and y values through the thickness of the deposited film.

25. A method according to claim 23 wherein (d) comprises removing the sputtering gas from the process zone by a cryo-turbo pump.

26. A method according to claim 23 wherein the non-reactive portion of the sputtering gas comprises argon and the oxygen-containing portion of the sputtering gas is oxygen.

27. A method according to claim 23 wherein (b) comprises applying a pulsed DC voltage that is pulsed on and off, the on voltage having a value of about 200 V to about 800 V.

28. A method of depositing a multiple layer dielectric film on a substrate, the method comprising:
- (a) placing a substrate in a process zone to face a target;
- (b) applying a pulsed DC voltage to the target;
- (c) in a first stage, introducing a first sputtering gas into the process zone, the first sputtering gas comprising a non-reactive component and a reactive component in a first ratio that is selected to deposit a dielectric film having a first ratio of elements;
- (d) in a second stage, introducing a second sputtering gas into the process zone, the second sputtering gas comprising a non-reactive component and a reactive component in a second ratio that is selected to deposit a dielectric film having a second ratio of elements that is a different ratio than the first ratio; and
- (e) removing the first and second sputtering gases from the process zone by:
  - (i) condensing at least some of the non-reactive component of the gases on a cooled surface external to the process zone; and
  - (ii) exhausting at least some of the reactive component of the gases from the process zone with moving rotors.

29. A method according to claim 28 comprising changing the ratio of the non-reactive component to the reactive component of the first and second sputtering gases between step (c) and (d) in discrete steps.

30. A method according to claim 28 wherein (e) comprises using a cryo-turbo pump.

31. A method according to claim 28 wherein (i) the non-reactive portion of the first and second process gases comprises argon, and (ii) the reactive component comprises oxygen-containing gas or nitrogen-containing gas.

32. A method according to claim 28 wherein the target is tantalum, aluminum, hafnium, indium-tin oxide, or silicon.

33. A method according to claim 28 wherein (b) comprises applying a pulsed DC voltage that is pulsed on and off, the on voltage having a value of about 200 V to about 800 V.

* * * * *